United States Patent [19]
Suzuki

[11] Patent Number: 6,035,115
[45] Date of Patent: Mar. 7, 2000

[54] METHOD FOR PERFORMING SIMULATION OF A SEMICONDUCTOR INTEGRATED CIRCUIT USING A RELATIVE VARIATION MODEL

[75] Inventor: Kyou Suzuki, Tokyo, Japan

[73] Assignee: NEC Corporation, Tokyo, Japan

[21] Appl. No.: 09/030,420

[22] Filed: Feb. 25, 1998

[30] Foreign Application Priority Data

Feb. 26, 1997 [JP] Japan .................................. 9-042173

[51] Int. Cl.[7] .................................................. G06F 9/455
[52] U.S. Cl. ...................................................... 395/500.36
[58] Field of Search ................................ 714/33; 702/64; 395/500.06, 500.07, 500.34, 500.35, 500.36, 500.4

[56] References Cited

U.S. PATENT DOCUMENTS

| | | | |
|---|---|---|---|
| 4,744,084 | 5/1988 | Beck et al. ........................... | 714/33 |
| 5,590,063 | 12/1996 | Golio et al. ......................... | 702/64 |
| 5,621,652 | 4/1997 | Eakin .................................. | 395/500.06 |
| 5,692,160 | 11/1997 | Sarin .................................. | 395/500.44 |

FOREIGN PATENT DOCUMENTS

| | | |
|---|---|---|
| 5-281293 | 10/1993 | Japan . |
| 6-348683 | 12/1994 | Japan . |

*Primary Examiner*—Kevin J. Teska
*Assistant Examiner*—Dan Fiul
*Attorney, Agent, or Firm*—Sughrue, Mion, Zinn, Macpeak & Seas, PLLC

[57] ABSTRACT

A method for performing simulation of a semiconductor integrated circuit is disclosed in which a circuit simulation result taking into consideration can be obtained relative variation. In the method, possible maximum and minimum values of an element parameter, i.e., element parameters of a worst case taking into consideration the relative variation is determined from prescribed absolute and relative variation ranges to form a variation model. Based on the variation model, worst-case simulation is carried out taking into account the relative variation.

5 Claims, 3 Drawing Sheets

ન,૧૧૫

METHOD FOR PERFORMING SIMULATION OF A SEMICONDUCTOR INTEGRATED CIRCUIT USING A RELATIVE VARIATION MODEL

BACKGROUND OF THE INVENTION

1. Field of the Invention

The present invention relates to a method for performing a simulation of a semiconductor integrated circuit taking into consideration its manufacturing fluctuations.

2. Description of the Related Art

In the optimizing design or statistical analysis of a semiconductor integrated circuit, a massive amount of time is required for the computation of circuit characteristics for its analysis. For this reason, one of problems associated directly with improvement of the design quality and manufacturing yield is to minimize the computation time.

Conventional methods for performing a simulation of a semiconductor integrated circuit include a worst case simulation as a general method in which variation ranges are given to element parameters. In the worst case simulation, a vertex method or a moment method is often used. In the vertex method, the distributions of statistical parameters are all regarded as uniform distributions and one of vertexes in a parameter variation region is taken as a worst case. This worst case simulation method requires a less amount of computation but disadvantageously fails to take correlation between parameters into consideration, which leads to an overestimated or underestimated result. The moment method, on the other hand, can take the correlation between parameters into account but has a limitation that circuit characteristics must be ensured to be linear, for which reason this method requires great care when it is actually employed.

Meanwhile, in the case of this prior art such as disclosed in Japanese Patent Laid-Open Publication No. 348683/94, as shown in FIG. 1, items for consideration or examination such as amplification gain and harmonic distortion factors and parameters having variation ranges for common-emitter current transfer ratio hfe and semiconductor resistance of a transistor are input from an input device 304, and a probability interpolation model forming section 301 finds sampling data which provide the maximum approximation accuracy from the parameters having variation ranges, and forms an interpolation model based on the found data. Next, a statistical analysis section 302 determines a worst case based on the Monte-Carlo simulation with use of the interpolation model and the result is displayed by a result display section 303.

The aforementioned prior art can form an interpolation model with a less amount of computation by determining sampling data that provides a maximum approximation accuracy, with the result that analysis accuracy can be maintained with a smaller number of simulating operations. However, this method is disadvantageous in that the statistical analysis eventually uses Monte-Carlo simulation and thus requires a considerable number of simulating operations to secure a sufficiently improved approximation accuracy, though the method uses fewer computing operations than the general Monte-Carlo simulation.

For example, the number N of simulating operations required for an average error f obtained through the simulation to be within ±10% of population mean F, is about 100 when $3\sigma=1$ in an expression (1) which follows.

$$\overline{f} - 3\sigma/\sqrt{N} \leq F \leq \overline{f} + 3\sigma/\sqrt{N} \quad (1)$$

where, F denotes a population mean of characteristic (f), $\overline{f}$ is a mean of simulations, $3\sigma$ is a parameter variation range, and N is a simulation frequency.

Since a semiconductor integrated circuit has manufacturing fluctuations, parameter variation ranges are given to elements on the semiconductor integrated circuit. The variation ranges include an absolute variation range defined by maximum and minimum element parameter variations and a relative variation range defined by aligned elements which are positioned adjacent to each other on the semiconductor integrated circuit and are regarded as aligned ones when they have the same structure and shape. In the relative variation range, a difference between the values of a parameter of the aligned elements is defined as its variation range, because the aligned elements are influenced by manufacturing fluctuations to the same extent and thus have nearly the same element parameter value. In general, the relative variation range is narrower than the absolute variation range.

The prior art has disadvantages in that computation to form the interpolation model is required in addition to the simulation. As a result, when the aforementioned relative variation range is taken into account, the computation to form the interpolation model disadvantageously becomes more difficult.

SUMMARY OF THE INVENTION

It is therefore an object of the present invention to provide a method for performing a simulation of a semiconductor integrated circuit, in which a circuit simulated result can be obtained with a smaller number of simulating operations than that of a prior art worst case simulation based on a Monte-Carlo simulation, while taking into account relative variations.

In the present invention, worst case simulation taking relative variations into consideration is carried out using a variation model based on maximum and minimum element parameters (worst case element parameters considering the relative variations) defining absolute and relative variation ranges. Accordingly, a circuit simulated result taking into consideration relative variations can be obtained with a smaller number of simulating operations than that in the prior art worst case simulation based on the Monte-Carlo simulation. In addition, since the variation model of the present invention converts only the element values to values in the variation ranges, it requires a less amount of computation when compared to that necessary for forming the interpolation model in the prior art and facilitates the consideration of the relative variation range.

Assuming that the number of parameter elements is denoted by n, the number of sets of aligned elements is denoted by m, then the number Np of simulating operations is expressed as follows.

$$Np=2^n \times (1+2^m)+1$$

The last term "1" in the above equation corresponds to nominal value.

It will be appreciated from the above equation that, when n=1 and m=1, Np becomes 7 that is smaller than N=100 in the prior art method (Monte-Carlo simulation).

The above and other objects, features and advantages of the present invention will become apparent from the following description with reference to the accompanying drawings which illustrate examples of the present invention.

DESCRIPTION OF THE PREFERRED EMBODIMENTS

Figure 1:
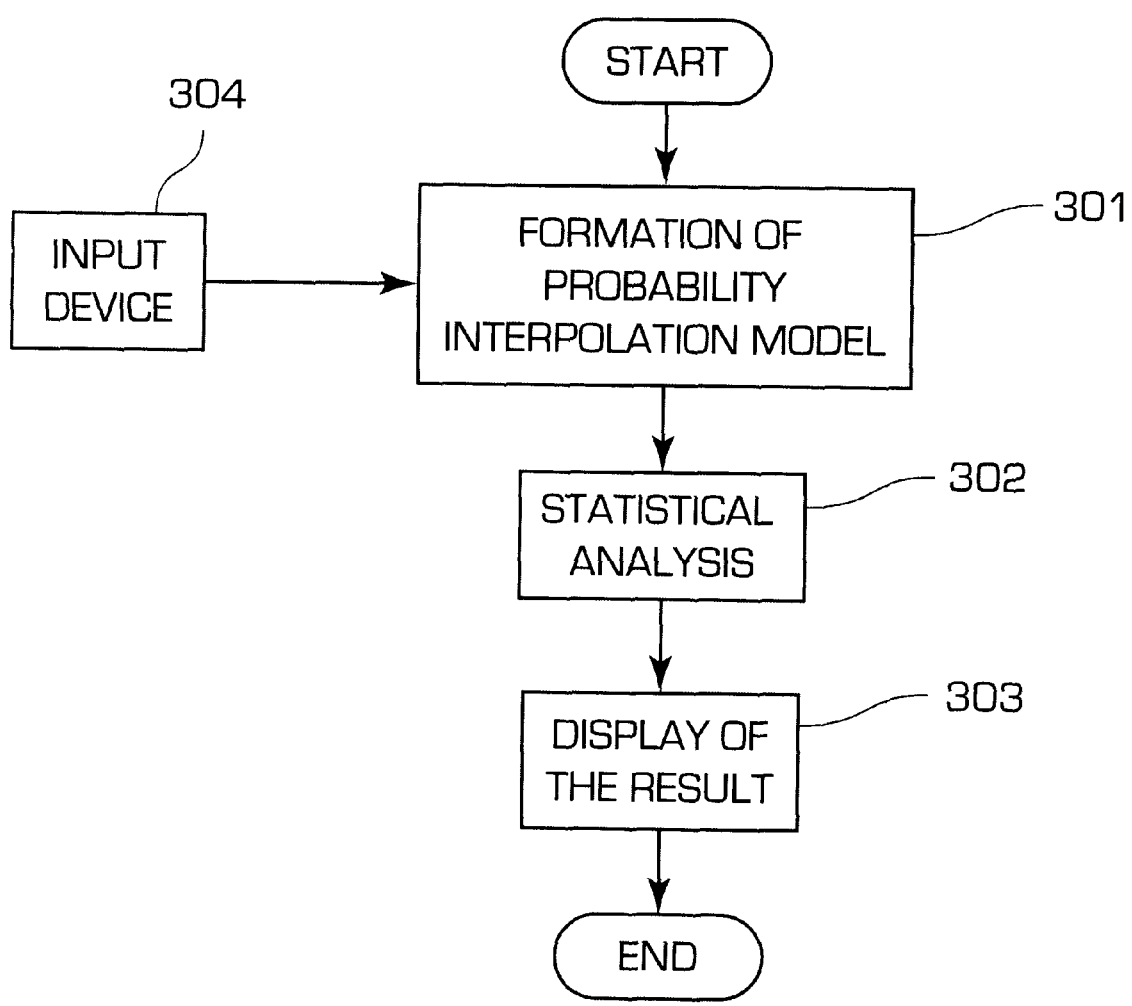
FIG. 1 is a flow chart showing a processing procedure of a prior art.
Figure 2:
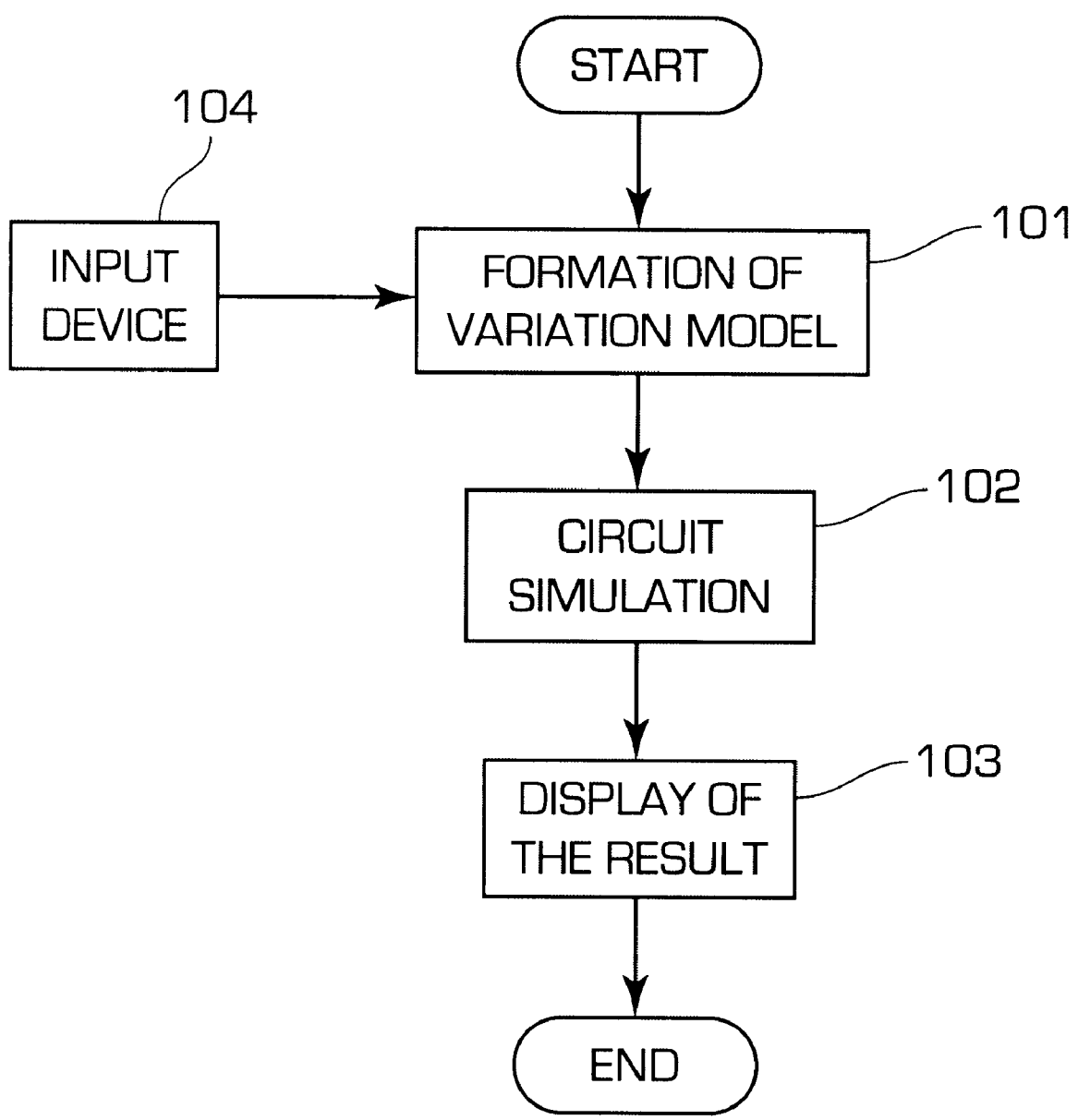
FIG. 2 is a flow chart explaining a processing procedure of a method for performing a simulation of a semiconductor integrated circuit in accordance with an embodiment of the present invention.

A method for simulating a semiconductor integrated circuit in accordance with an embodiment of the present invention will be explained with reference to FIG. 2.

Referring to the drawing, an input device 104 stores therein, in addition to circuit connection information and analysis conditions for use in the circuit simulation, relative assignments by which aligned elements are denoted by the same number as well as data relating to variation ranges of absolute and relative variation ranges of resistor elements.

Shown in Table 1 below is an example of circuit connection information stored in an internal memory of the input device 104, wherein an element starting with Q in a column "ELEMENT NUMBER" is a transistor, an element starting with R is a resistor, an element starting with V is a power source, numbers in collector, base and emitter fields of an item "TERMINAL CONNECTION NUMBER" denote terminal connection numbers of the element. In a column "TYPE", N denotes a transistor type, L and H denote a resistor type, DC and AC denote a power source type. In a column "RELATIVE DESIGNATION", elements having the same number have amutually aligned relationship. A blank field denotes no corresponding information. In this example, the number of data pieces is 8 (rows).

TABLE 1

| ROW | ELEMENT NUMBER | TERMINAL CONNECTION NUMBER | | | ELEMENT VALUE | TYPE | RELATIVE DESIGNATION |
| | | COLLECTOR (+ SIDE) | BASE (– SIDE) | EMITTER | | | |
|---|---|---|---|---|---|---|---|
| 1 | Q1 | 1 | 2 | 3 | | N | |
| 2 | R1 | 3 | 0 | | 200 | L | |
| 3 | R2 | 4 | 3 | | 100 | L | |
| 4 | R3 | 4 | 2 | | 3000 | H | 1 |
| 5 | R4 | 2 | 0 | | 1000 | H | 1 |
| 6 | R5 | 1 | 0 | | 50 | L | |
| 7 | V1 | 4 | 0 | | 10 | DC | |
| 8 | V2 | 2 | 0 | | 1 | AC | |

Table 2 shows an example of variation ranges stored in the internal memory of the input device 104, wherein L and H in a column "TYPE" denote a resistor type, fields "MAXI-

TABLE 2

| | | ABSOLUTE VARIATION RANGE (%) | | RELATIVE VARIATION RANGE (%) | |
|---|---|---|---|---|---|
| DATA | TYPE | MAX. | MIN. | MAX. | MIN. |
| 1 | L | +20 | −20 | +5 | −5 |
| 2 | H | +15 | −15 | +3 | −3 |

When finding a combination of element values corresponding to the worst case from the data stored in the input device 104, a variation model formation section 101 uses as a variation model the combination of element values obtained considering not only the absolute variation range but also the relative variation range.

Figure 3:
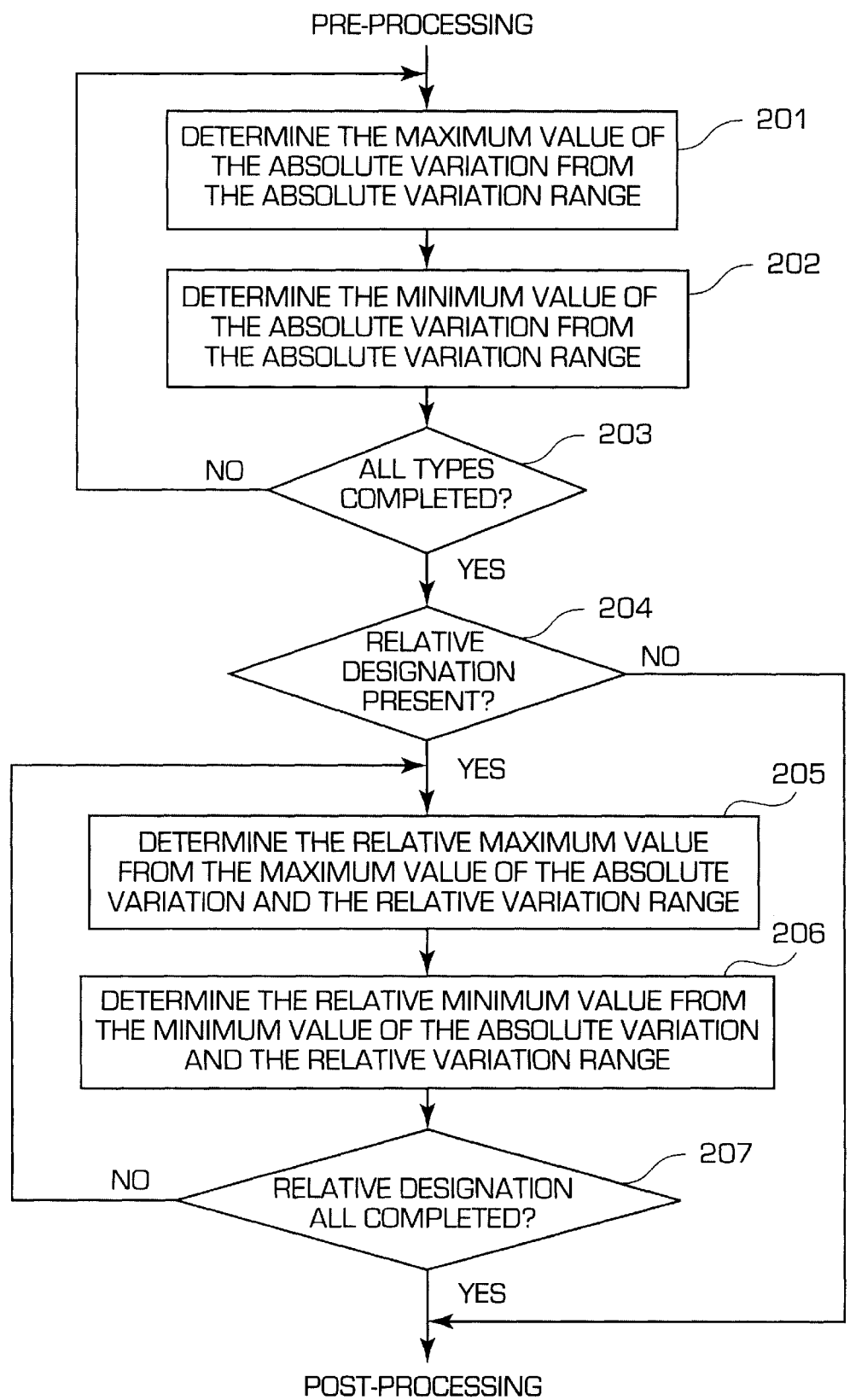
FIG. 3 is a flow chart for explaining the processing of model 101 in FIG. 1.

FIG. 3 is a flow chart for explaining the processing procedure of the model formation section 101, and Table 3 shows data stored in the internal memory for explaining the variation model.

TABLE 3

| | ELEMENT | ABSOLUTE VARIATION | | RELATIVE VARIATION | | | | |
|---|---|---|---|---|---|---|---|---|
| DATA | NUMBER | MAX. | MIN. | MAX.1 | MIN.1 | MAX.2 | MIN.2 | ... |
| 1 | R1 | 240 | 160 | 240 | 160 | 240 | 160 | ... |
| 2 | R2 | 120 | 80 | 120 | 80 | 120 | 80 | ... |
| 3 | R3 | 3450 | 2550 | 3360 | 2640 | 3450 | 2550 | ... |
| 4 | R4 | 1150 | 850 | 1150 | 850 | 1120 | 880 | ... |
| 5 | R5 | 60 | 40 | 60 | 40 | 60 | 40 | ... |

MUM" and "MINIMUM" in the second column "ABSOLUTE VARIATION RANGE" and third column "RELATIVE VARIATION RANGE" denote maximum and minimum values of the absolute and relative variation ranges in percentages (%) with respect to the element value, respectively. In this example, the number of data pieces is 2 (rows).

First, in a step 201, the element value of the circuit connection information (Table 1) corresponding to the type of the resistor element of the variation range (Table 2) is converted in terms of the maximum value of the absolute variation range to determine an absolute variation maximum value, and the found maximum value is stored in the internal memory. In the next step 202, similarly to the step 201, an absolute minimum value is determined and then stored in the internal memory. In a step 203, the operations of the steps 201 and 202 are executed for all the element values of the circuit connection information (Table 1) corresponding to the type of the resistor element of the variation range (Table 2).

Next, it is determined in a step 204 whether relative designation is present in the circuit connection information (Table 1). In the presence of the relative designation, the absolute variation maximum value (Table 3) corresponding to one (R3) of the elements of the relative designation is converted to determine a relative variation maximum value in the relative variation range in a step 205. In this case, since the element value will not exceed the absolute variation range, a value obtained by subtracting the minimum value of the relative variation range from the absolute variation maximum value (Table 3) is stored in the internal memory as the relative variation maximum value (maximum value 1 in Table 3) of the variation model. Subsequently, in a step 206, similarly to the step 205, a value obtained by adding the maximum value of the relative variation range to the absolute variation minimum value (Table 3) is stored in the internal memory as a relative variation minimum value (minimum value 1 in Table 3). In a step 207, further, the operations of the steps 205,206 are carried out for next one (R4 next to the element R3) of the elements of the relative designation to determine a relative variation maximum value (maximum value 2 in Table 3) of the variation model and a relative variation minimum value (minimum value 2 in Table 3) thereof, and the determined relative variation maximum and minimum values are stored in the internal memory. The operations of the steps 205 and 206 are repeated until the corresponding element of the relative designation becomes null.

In this connection, it is impossible that the relative variations of the elements of the relative designation all have the same direction (positive or negative), whereby the maximum 1, e.g., for the element R4 is computed to be 1180 (=1150+1000×0.03) and the minimum 1 thereof is to be 820 (=850−1000×0.03). However, since these values are larger than the absolute variation maximum value and are smaller than the absolute variation minimum value respectively, the maximum value 1 and minimum value 1 of the element R4 become equal to the absolute variation maximum and minimum values respectively. The same holds true even for the maximum value 2 and minimum value 2 of the element R3. In the present example, since the elements corresponding to the relative designation are only two of the elements R3 and R4, data of the maximum value 3 and minimum value 3 and subsequent values are not present in the variation model (Table 3).

Subsequently, in a circuit simulation section 102, circuit simulation is carried out with use of the circuit connection information (Table 1) under analysis conditions. More specifically, the element values of the resistor elements are replaced by the values of the aforementioned variation models (Table 3), and the circuit simulation is carried out the number of times corresponding to the number of variation models (6 times corresponding to the second to seventh rows, in this example), and a circuit simulation result is displayed in a result display section 103.

The above explanation has been made in connection with a case where the number of elements of the relative designation is 2 (the element R3 in the row 4 and the element R4 in the row 5 in Table 1) and the number of combination sets is 1 (Table 1) in the present embodiment. However, when the number of combination sets is 2 or more, operations similar to those of the steps 205 to 207 of the model 101 (refer to FIG. 2) are carried out for the values of the above variation models (the third to eighth rows in Table 3 and when the number of combination sets is 3 or more, the ninth row and subsequent rows are also included therein), thus exhibiting substantially the same effects as in the present embodiment.

Although the above explanation has been made in the connection of the case where resistor elements are used as the relatively designated elements in the present embodiment, similar operations to the present embodiment can be carried out even for parameters of an active element such as a transistor or diode or for values/parameters of a passive element such as a capacitive element or inductor to obtain substantially the same effects as in the present embodiment.

While preferred embodiments of the present invention have been describe using specific terms, such description is for illustrative purposes only, and it is to be understood that changes and variations may be made without departing from the spirit or scope of the following claims.

What is claimed is:

1. A method for performing simulation of a semiconductor integrated circuit comprising:
   a variation model formation step of determining possible maximum and minimum values of an element parameter from prescribed absolute and relative variation ranges, wherein the element parameters of a worst-case simulation take relative variation into consideration to form a variation model; and
   a circuit simulation step of performing worst-case simulation with use of the variation model taking the relative variation into consideration.

2. A method for performing simulation of a semiconductor integrated circuit comprising:
   a variation model formation step of determining possible maximum and minimum values of an element parameter from prescribed absolute and relative variation ranges, wherein the variation model formation step includes the steps of:
   converting the element value in terms of maximum and minimum values of the absolute variation range to determine absolute variation maximum and minimum values with respect to all elements,
   converting the absolute variation maximum values of the elements of relative designation indicative of the mutually aligned elements in the relative variation range to determine a relative variation maximum value,
   converting the absolute variation minimum values thereof in the relative variation range to determine a relative variation minimum value, wherein the circuit simulation step includes the steps of:
   replacing the element values of the elements by the absolute variation maximum and minimum values, and
   replacing the element values of the elements of the relative designation by the relative variation maximum and minimum values to perform the circuit simulation; and
   a circuit simulation step using the variation model, thereby taking the relative variation into consideration.

3. A computer program product for enabling a computer to perform simulation of a semiconductor integrated circuit comprising:
   software instructions for enabling the computer to perform predetermined operations, and
   a computer readable medium bearing the software instructions;
   the predetermined operations including the steps of:
   determining possible maximum and minimum values of an element parameter from prescribed absolute and relative variation ranges, wherein the element parameters of a worst-case simulation take relative variation into consideration to form a variation model; and performing a worst-case simulation with use of the variation model.

4. A computer program product for enabling a computer to perform simulation of a semiconductor integrated circuit comprising:

software instructions for enabling the computer to perform predetermined operations, and a computer readable medium bearing the software instructions;

the predetermined operations including the steps of:

determining possible maximum and minimum values of an element parameter from prescribed absolute and relative variation ranges, wherein the variation model formation step includes the steps of:

converting the element value in terms of maximum and minimum values of the absolute variation range to determine absolute variation maximum and minimum values with respect to all elements, converting the absolute variation maximum values of the elements of relative designation indicative of the mutually aligned elements in the relative variation range to determine a relative variation maximum value, converting the absolute variation minimum values thereof in the relative variation range to determine a relative variation minimum value, wherein the circuit simulation step includes the steps of:

replacing the element values of the elements by the absolute variation maximum and minimum values, and replacing the element values of the elements of the relative designation by the relative variation maximum and minimum values to perform the circuit simulation; and using the variation model to simulate circuit, thereby taking the relative variation into consideration.

5. A system for performing simulation of a semiconductor integrated circuit comprising:

a variation model formation component for determining possible maximum and minimum values of an element parameter from prescribed absolute and relative variation ranges, wherein element parameters of a worst-case simulation take relative variation into consideration to form a variation model; and a circuit simulation component for performing worst-case simulation with use of the variation model taking the relative variation into consideration.

* * * * *